United States Patent
Sanada et al.

(10) Patent No.: US 6,656,277 B2
(45) Date of Patent: Dec. 2, 2003

(54) APPARATUS FOR AND METHOD OF PROCESSING SUBSTRATE

(75) Inventors: Masakazu Sanada, Kyoto (JP); Masahiko Harumoto, Kyoto (JP); Hiroshi Kobayashi, Kyoto (JP); Minobu Matsunaga, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 0 days.

(21) Appl. No.: 10/270,885

(22) Filed: Oct. 11, 2002

(65) Prior Publication Data

US 2003/0168007 A1 Sep. 11, 2003

(30) Foreign Application Priority Data

Mar. 8, 2002 (JP) ...................... P2002-063015

(51) Int. Cl.[7] .............................. B05C 5/00; B05B 13/02
(52) U.S. Cl. .................... 118/320; 118/52; 118/321; 438/782
(58) Field of Search ................. 118/52, 320, 321; 438/749, 782

(56) References Cited

U.S. PATENT DOCUMENTS

| | | | | |
|---|---|---|---|---|
| 5,989,632 A | * | 11/1999 | Sanada et al. | 427/240 |
| 6,190,063 B1 | * | 2/2001 | Akimoto | 396/611 |
| 6,440,218 B1 | * | 8/2002 | Sanada et al. | 118/697 |
| 6,503,003 B2 | * | 1/2003 | Hasebe et al. | 396/611 |
| 6,551,400 B2 | * | 4/2003 | Hasbe et al. | 118/52 |
| 6,558,053 B2 | * | 5/2003 | Shigemori et al. | 396/611 |
| 2001/0009135 A1 | * | 7/2001 | Hasebe et al. | 118/52 |
| 2001/0014224 A1 | * | 8/2001 | Hasebe et al. | 396/579 |
| 2002/0152958 A1 | * | 10/2002 | Shigemori et al. | 118/663 |

FOREIGN PATENT DOCUMENTS

| | | |
|---|---|---|
| JP | 10-20508 | 1/1998 |
| JP | 10-340836 | 12/1998 |

* cited by examiner

*Primary Examiner*—Alexander Ghyka
(74) *Attorney, Agent, or Firm*—Ostrolenk, Faber, Gerb & Soffen, LLP

(57) ABSTRACT

A developer supply nozzle moves from the side of a first edge of a substrate to the side of a second edge thereof opposite from the first edge to apply a developer across a major surface of the substrate. After a lapse of required development process time, a rinsing solution supply nozzle moves from the side of the first edge of the substrate to the side of the second edge thereof to apply a rinsing solution across the major surface of the substrate. Making the moving speed of the rinsing solution supply nozzle higher than the moving speed of the developer supply nozzle shortens actual developing time at a site (downstream relative to a scanning direction) where a development reaction is apt to accelerate under the influence of fluctuations of the developer caused by dropping of the rinsing solution.

7 Claims, 7 Drawing Sheets

F I G. 5
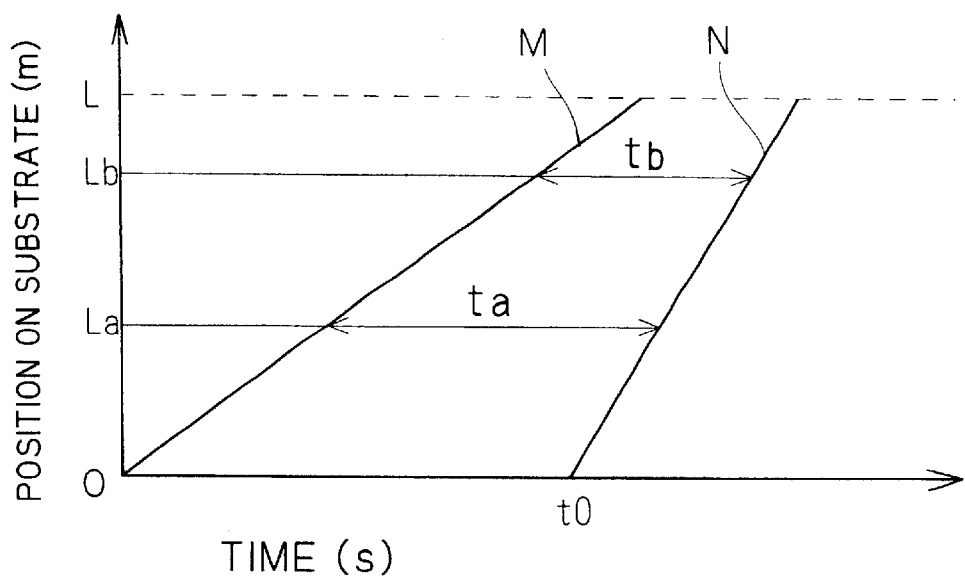

F I G . 6
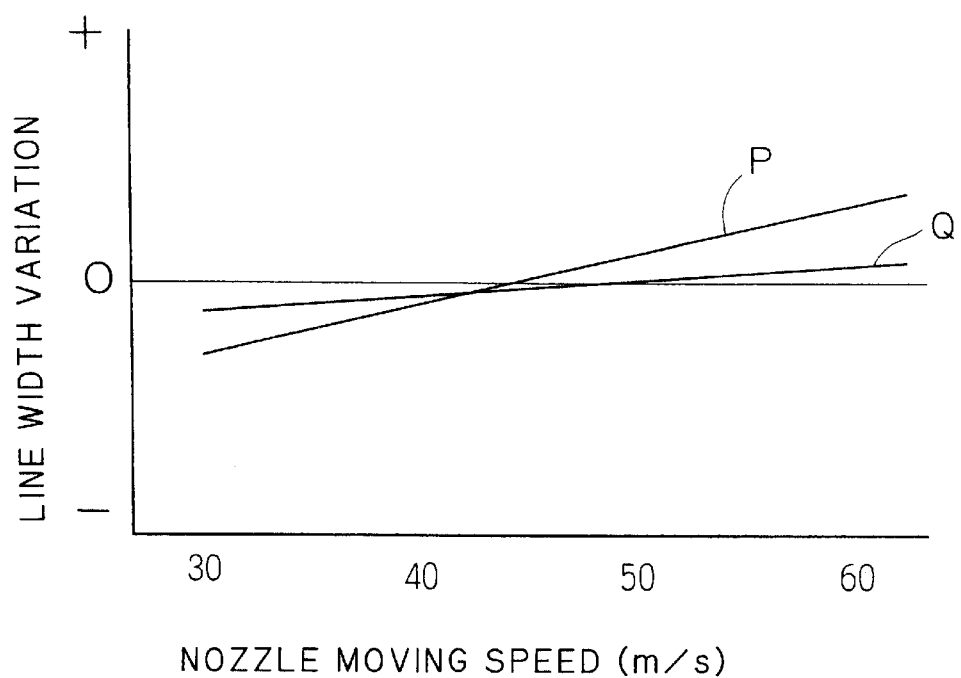

APPARATUS FOR AND METHOD OF PROCESSING SUBSTRATE

BACKGROUND OF THE INVENTION

1. Field of the Invention

The present invention relates to an apparatus for and method of performing a development process on a substrate including a semiconductor wafer, a glass substrate for a liquid crystal display panel, a glass substrate for a plasma display panel, and the like.

2. Description of the Background Art

A conventional method of developing a substrate includes: moving a developer supply nozzle from the side of a first edge of a substrate to the side of a second edge thereof opposite from the first edge to apply a developer (or a developing solution or liquid) onto the entire upper surface of the substrate (which method of applying a developer is referred to as a "slit scan development method"); and, after a lapse of a predetermined period of time, moving a rinsing solution supply nozzle from the side of the first edge of the substrate to the side of the second edge thereof at the same speed as the developer supply nozzle to apply a rinsing solution onto the entire upper surface of the substrate, thereby stopping development on the upper surface of the substrate.

This method of development is intended to provide substantially the same developing time throughout the upper surface of the substrate by moving the developer supply nozzle and the rinsing solution supply nozzle at the same speed, to prevent nonuniform development and to improve the uniformity of the line width of a resist pattern after the development.

However, various experiments have shown that the resist pattern tends to have a line width less than a desired dimension in an area toward which the rinsing solution supply nozzle moves (or on the side of the second edge of the substrate) to result in insufficient development uniformity.

This problem is considered to result from the following phenomenon. In the above-mentioned method of development, as shown in FIG. 8, a rinsing solution dropped from a rinsing solution supply nozzle 110 into a developer 101 formed in a puddle on a substrate W causes more or less vibrations (or fluctuations) 102 of the puddle of developer 101. The vibrations 102 are transferred to the area toward which the rinsing solution supply nozzle 110 moves, thereby to accelerate a development reaction because of a so-called agitation action.

SUMMARY OF THE INVENTION

The present invention is intended for a substrate processing apparatus which applies a developer onto a substrate to effect development, and then applies a rinsing solution onto the substrate to stop the development.

According to the present invention, a substrate processing apparatus comprises: a substrate holder for holding a substrate; a developer supply nozzle including a first discharge opening having a length substantially not less than the size of a major surface of the substrate; a first moving mechanism for moving the developer supply nozzle from the side of a first edge of the substrate to the side of a second edge of the substrate opposite from the first edge; a rinsing solution supply nozzle including a second discharge opening having a length substantially not less than the size of the major surface of the substrate; a second moving mechanism for moving the rinsing solution supply nozzle from the side of the first edge of the substrate to the side of the second edge of the substrate; and a controller for causing the developer supply nozzle to move in a first moving speed pattern from the side of the first edge of the substrate to the side of the second edge of the substrate to apply a developer onto the major surface of the substrate, and then causing the rinsing solution supply nozzle to move in a second moving speed pattern from the side of the first edge of the substrate to the side of the second edge of the substrate to apply a rinsing solution onto the major surface of the substrate, wherein the first moving speed pattern and the second moving speed pattern are established so that developing time at different sites of the substrate decreases in proceeding from the side of the first edge to the side of the second edge.

The substrate processing apparatus according to the present invention can shorten developing time at a site where a development reaction is apt to accelerate, to further improve line width uniformity.

Preferably, the second discharge opening discharges the rinsing solution in a first direction opposite from a second direction in which the rinsing solution supply nozzle moves from the side of the first edge of the substrate to the side of the second edge of the substrate.

This prevents the rinsing solution from flowing ahead of the rinsing solution supply nozzle and from forcing the developer on the substrate to flow ahead of the rinsing solution supply nozzle.

Preferably, the substrate processing apparatus further comprises: a development condition obtaining section for obtaining a development condition; and a speed pattern establishing section for establishing at least one of the first moving speed pattern and the second moving speed pattern in accordance with the obtained development condition.

The substrate processing apparatus can further improve the line width uniformity in accordance with a change in development condition.

According to another aspect of the present invention, a method of processing a substrate comprises the steps of: applying a developer onto a major surface of a substrate while scanning in a first scanning rate pattern from the side of a first edge of the substrate to the side of a second edge of the substrate opposite from the first edge; and applying a rinsing solution onto the major surface of the substrate while scanning in a second scanning rate pattern from the side of the first edge of the substrate to the side of the second edge of the substrate after the application of the developer onto the major surface of the substrate, wherein the first scanning rate pattern and the second scanning rate pattern are established so that developing time at different sites of the substrate decreases in proceeding from the side of the first edge to the side of the second edge.

The method according to the present invention can shorten the developing time at a site where a development reaction is apt to accelerate, to further improve line width uniformity.

According to still another aspect of the present invention, an apparatus for chemically processing a major surface of a substrate comprises: an applying part for applying a chemical solution sequentially onto a first region and a second region of the major surface; and a removing part for removing the chemical solution sequentially from the first region and the second region, wherein a first exposure time period for which the first region is exposed to the chemical solution is longer than a second exposure time period for which the second region is exposed to the chemical solution.

It is therefore an object of the present invention to provide an apparatus for and method of improving line width uniformity in substrate processing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows a relationship between the time after the beginning of movement of nozzles and the position of the nozzles with respect to a substrate;

FIG. 6 shows a relationship between a moving speed of the rinsing solution supply nozzle and variations in line width of a pattern;

DESCRIPTION OF THE PREFERRED EMBODIMENTS

First Preferred Embodiment

A substrate processing apparatus according to a first preferred embodiment of the present invention will now be described.

Figure 1:
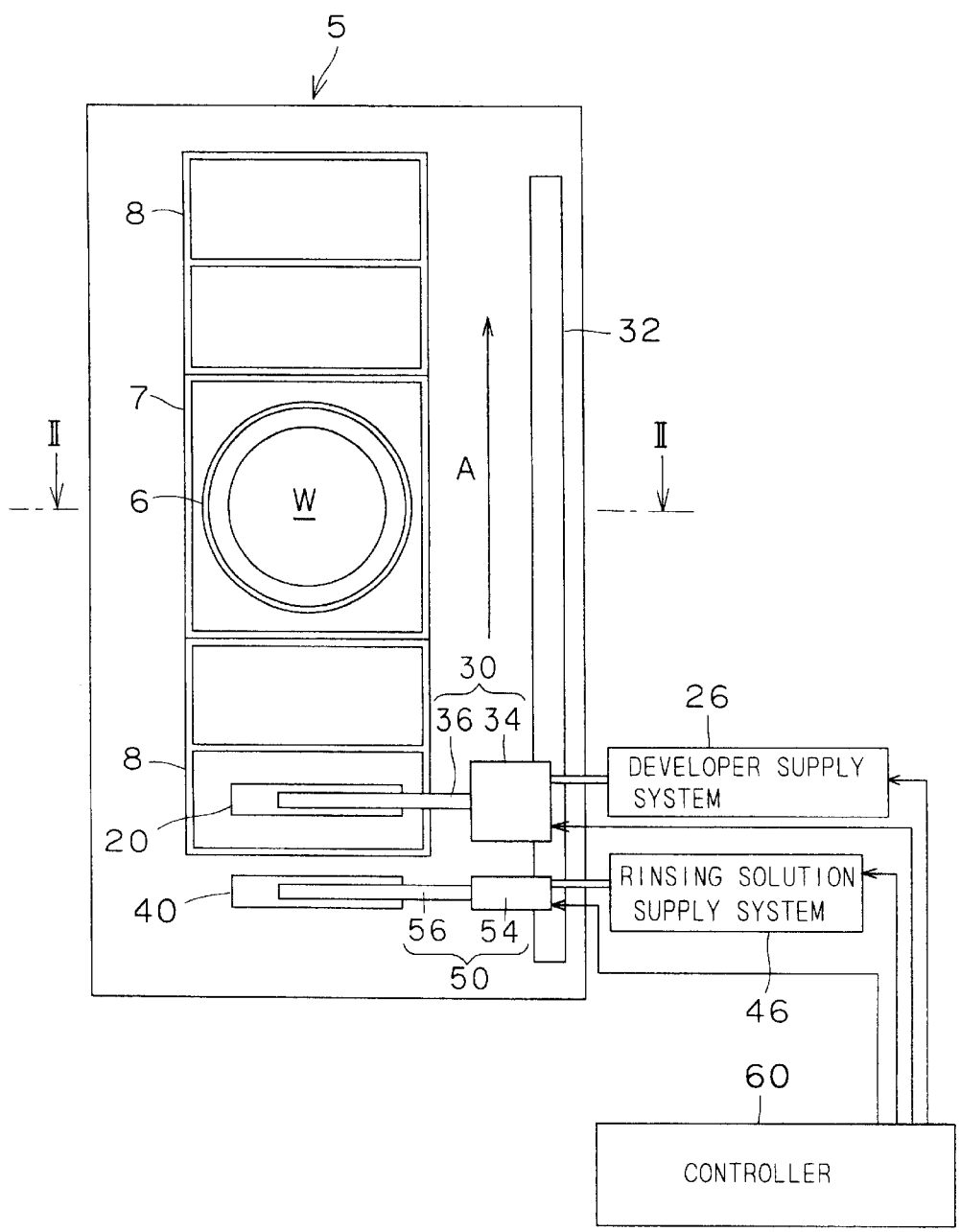
FIG. 1 is a schematic plan view of a substrate processing apparatus according to a first preferred embodiment of the present invention.
Figure 2:
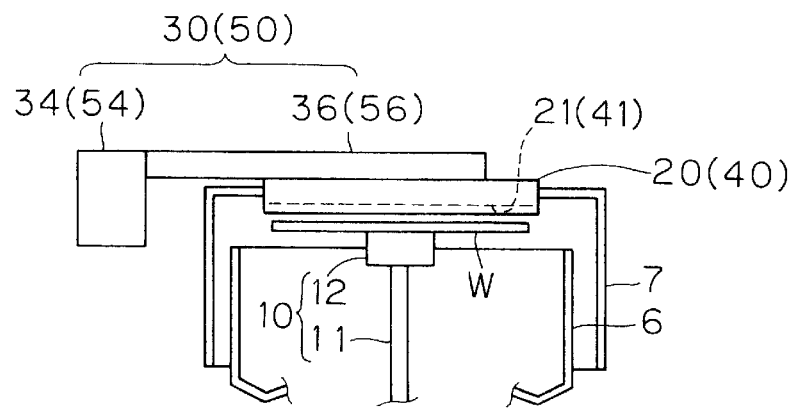
FIG. 2 is a sectional view taken along the line II—II of FIG. 1.

FIG. 1 is a schematic plan view of the substrate processing apparatus according to the first preferred embodiment of the present invention. FIG. 2 is a sectional view taken along the line II—II of FIG. 1.

The substrate processing apparatus applies a developer (or a developing solution or liquid) onto a substrate W after an exposure process to perform a development process. The substrate processing apparatus comprises a substrate holder 10 for holding the substrate W in place, a developer supply nozzle 20, a first moving mechanism 30 for moving the developer supply nozzle 20, a rinsing solution supply nozzle 40, a second moving mechanism 50 for moving the rinsing solution supply nozzle 40, and a controller 60 for operation control of the entire apparatus.

The substrate holder 10 holds the substrate W in a substantially horizontal position. More specifically, the substrate holder 10 includes a support shaft 11 disposed in a substantially vertical position generally in a midsection of an apparatus body 5, and a support platform 12 fixedly provided on the upper end of the support shaft 11. The support platform 12 is capable of vacuum-holding the substrate W in a substantially horizontal position thereon. The mechanism of the support platform 12 is not limited to vacuum-holding the substrate W thereon but may be other mechanisms, for example, grasping a periphery of the substrate W.

An inner cup 6 circular in plan view is provided around the substrate holder 10 to surround the substrate W, and an outer cup 7 substantially rectangular in plan view is provided around the outer periphery of the inner cup 6. A pair of standby pots 8 are provided on opposite sides of the outer cup 7.

The developer supply nozzle 20 has a discharge opening or slit 21 (See FIG. 2) having a length approximately equal to or greater than the size of a major surface of the substrate W (in this preferred embodiment, the diameter of a circle defining the general plan configuration of the substrate W). The developer is discharged from the entire length of the discharge opening 21 and applied across the substrate W.

A developer supply system mechanism 26 is coupled to the developer supply nozzle 20. The developer supply system mechanism 26 has a developer source (not shown) in which the developer is stored, and an open/close valve (not shown). The developer supply system mechanism 26 is adapted to supply the developer from the developer source to the developer supply nozzle 20 in predetermined timed relation in accordance with the open/close timing of the open/close valve.

The first moving mechanism 30 moves the developer supply nozzle 20 from the side of a first edge of the substrate W held by the substrate holder 10 to the side of a second edge thereof opposite from the first edge. In this preferred embodiment, the first moving mechanism 30 includes a horizontal driver 34 movable along a guide rail 32, and a support arm 36. The guide rail 32 is provided on the upper surface of the apparatus body 5 and extends horizontally alongside of the substrate holder 10. The horizontal driver 34 is movable horizontally along the guide rail 32 in a predetermined scanning direction A and in its opposite direction. The support arm 36 is supported by the horizontal driver 34 in a cantilevered fashion so as to extend to the side of the substrate holder 10. The support arm 36 has a free end on which the developer supply nozzle 20 is supported in a substantially horizontal position so as to extend in a direction orthogonal to the scanning direction A.

The horizontal driver 34 drives the developer supply nozzle 20 to be able to move over the major surface of the substrate W from the side of the first edge to the side of the second edge of the substrate W. While moving over the substrate W, the developer supply nozzle 20 discharges the developer as a chemical solution to apply the developer onto the substrate W from the side of the first edge to the side of the second edge of the substrate W.

The rinsing solution supply nozzle 40 has a discharge opening or slit 41 (See FIG. 2) having a length approximately equal to or greater than the size (or diameter) of the major surface of the substrate W. A rinsing solution is discharged from the entire length of the discharge opening 41 and applied across the substrate W.

Figure 3:
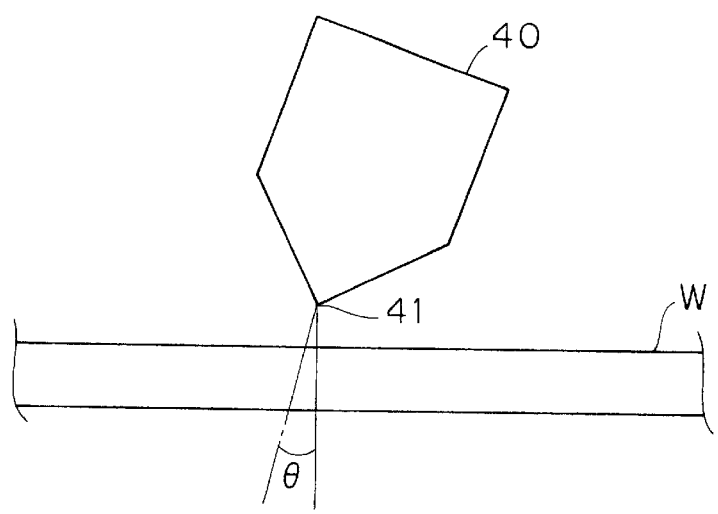
FIG. 3 is a schematic side view of a rinsing solution supply nozzle.

It should be noted that the discharge opening 41 of the rinsing solution supply nozzle 40 is configured to discharge the rinsing solution in a direction opposite from the scanning direction A, as shown in FIG. 3. More specifically, the discharge opening 41 of the rinsing solution supply nozzle 40 is oriented at an angle θ (in degrees) in a direction opposite from the scanning direction A with respect to the normal to the substrate W. Thus, the rinsing solution discharged from the discharge opening 41 flows in the direction opposite from the scanning direction A. This prevents the rinsing solution from flowing ahead of the rinsing solution supply nozzle 40 in the scanning direction A and from forcing the developer on the substrate W to flow ahead of the rinsing solution supply nozzle 40 in the scanning direction A.

A rinsing solution supply system mechanism 46 is coupled to the rinsing solution supply nozzle 40. The rinsing solution supply system mechanism 46 has a rinsing solution source (not shown) in which the rinsing solution is stored, and an open/close valve (not shown). The rinsing solution supply system mechanism 46 is adapted to supply the rinsing solution from the rinsing solution source to the rinsing solution supply nozzle 40 in predetermined timed relation in accordance with the open/close timing of the open/close valve.

The second moving mechanism 50 moves the rinsing solution supply nozzle 40 from the side of the first edge of the substrate W held by the substrate holder 10 to the side of the second edge thereof. In this preferred embodiment, the second moving mechanism 50 is similar in construction to the first moving mechanism 30. Specifically, the second moving mechanism 50 includes a horizontal driver 54 corresponding to the horizontal driver 34, and a support arm 56 corresponding to the support arm 36.

The horizontal driver 54 drives the rinsing solution supply nozzle 40 to move over the major surface of the substrate W. While moving over the substrate W, the rinsing solution supply nozzle 40 discharges the rinsing solution to apply the rinsing solution onto the substrate W from the side of the first edge to the side of the second edge of the substrate W.

The controller 60 controls the entire apparatus, and comprises a CPU, a ROM, a RAM, and the like. The controller 60 is constituted by a typical microcomputer for performing a predetermined computation in accordance with a previously stored software program.

The controller 60 controls a series of operations to be described below. The controller 60 controls at least the operation of the first moving mechanism 30 so as to move the developer supply nozzle 20 in a first moving speed pattern (or a first scanning rate pattern) and the operation of the second moving mechanism 50 so as to move the rinsing solution supply nozzle 40 in a second moving speed pattern (or a second scanning rate pattern).

The first and second moving speed patterns are established so that developing time at different sites of the substrate W decreases in proceeding from the first edge to the second edge of the substrate W (which will be detailed later).

In this preferred embodiment, the first moving speed pattern is defined as a constant speed pattern having a first moving speed V1, and the second moving speed pattern is defined as a constant speed pattern having a second moving speed V2 higher than the first moving speed V1.

The particulars of the first and second moving speed patterns vary depending on the type of resist, the supply flow rate of the developer, the supply flow rate of the rinsing solution, and a relative relationship between the first and second moving speed patterns. Therefore, the optimum values of the first and second moving speed patterns are previously determined by experiment or the like under predetermined development conditions.

General operation of the substrate processing apparatus constructed as discussed above will be described with reference to FIGS. 4A through 4D.

Figure 4A:
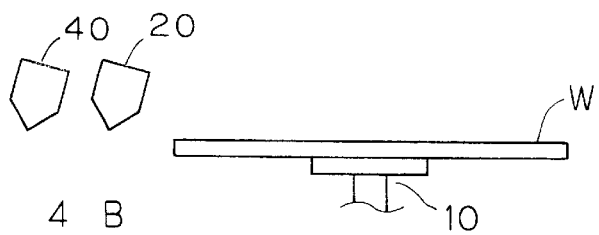
FIGS. 4A through 4D are schematic views showing the operation of the substrate processing apparatus in a step-by-step manner according to the first preferred embodiment.

In an initial standby state, the substrate W is supported in a horizontal position by the substrate holder 10, as illustrated in FIG. 4A. The developer supply nozzle 20 and the rinsing solution supply nozzle 40 are situated on the side of the first edge of the substrate W (upstream relative to the scanning direction A).

Figure 4B:
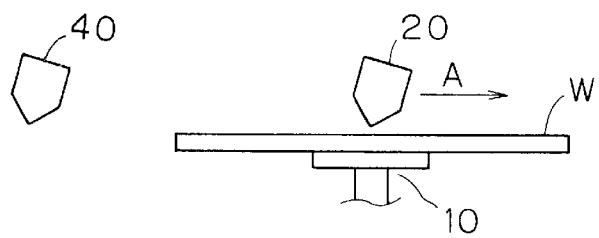

After the start of processing, the developer supply nozzle 20 first moves (scans) over the major surface of the substrate W in the scanning direction A, i.e., from the side of the first edge to the side of the second edge of the substrate W, as shown in FIG. 4B. While moving over the major surface of the substrate W, the developer supply nozzle 20 discharges the developer. In this process, the developer supply nozzle 20 moves in the first moving speed pattern. This provides the developer across the major surface of the substrate W in order from the side of the first edge to the side of the second edge to form a puddle of the developer, thereby effecting development on the major surface of the substrate W.

Figure 4C:
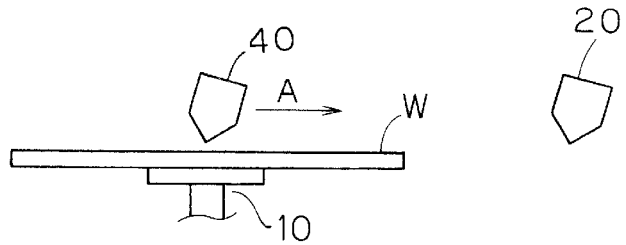

After a lapse of predetermined initial development process time required for development reaction on the substrate W since the passage of the developer supply nozzle 20 over the major surface of the substrate W, the rinsing solution supply nozzle 40 moves (scans) over the major surface of the substrate W in the scanning direction A, i.e., from the side of the first edge to the side of the second edge of the substrate W. as shown in FIG. 4C. While moving over the major surface of the substrate W, the rinsing solution supply nozzle 40 discharges the rinsing solution. In this process, the rinsing solution supply nozzle 40 moves in the second moving speed pattern. This provides the rinsing solution across the major surface of the substrate W in order from the side of the first edge to the side of the second edge of the substrate W to stop development.

Figure 4D:
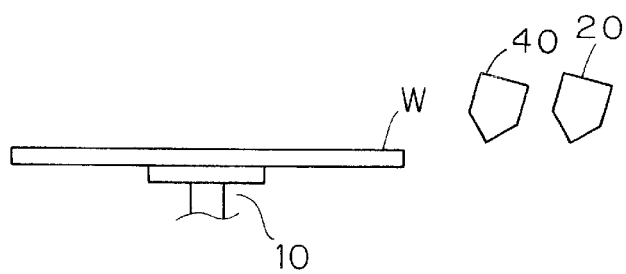

After the completion of a series of development process steps, the developer supply nozzle 20 and the rinsing solution supply nozzle 40 are situated on the side of the second edge of the substrate W (downstream relative to the scanning direction A), as shown in FIG. 4D.

A relationship between the first and second moving speed patterns and the developing time at different sites of the substrate W will be described.

FIG. 5 shows a relationship between the time after the start of movement of the developer supply nozzle 20 or the rinsing solution supply nozzle 40 and the position of the nozzles 20 and 40 with respect to the substrate W. The horizontal axis of FIG. 5 indicates a lapse of time since the start of movement of the developer supply nozzle 20, and the vertical axis thereof indicates the position of the nozzles 20 and 40 in the range from the first edge to the second edge of the substrate W. In FIG. 5, L denotes the position of the second edge of the substrate W.

The movement of the developer supply nozzle 20 from the first edge to the second edge of the substrate W in the first moving speed pattern having the constant first moving speed V1 is represented by the line M of FIG. 5. After a lapse of predetermined initial development process time (t0), the movement of the rinsing solution supply nozzle 40 from the first edge to the second edge of the substrate W in the second moving speed pattern having the constant second moving speed V2 higher than the first moving speed V1 is represented by the line N of FIG. 5. In this case, since the second moving speed V2 is higher than the first moving speed V1, the slope of the line N is greater than that of the line M.

The horizontal spacing between the lines M and N denotes the actual developing time at each site of the substrate W.

The actual developing time at the first edge of the substrate W equals the development process time (t0). At a site (or in a first region) spaced a distance La apart from the first edge of the substrate W in the scanning direction A, actual developing time ta is shorter than the development process time (t0). At a site (or in a second region) spaced a distance Lb (Lb>La) from the first edge of the substrate W in the scanning direction A, actual developing time tb is shorter than the development process time t0 and the time ta.

Thus, the developing time at different sites of the substrate W gradually decreases in proceeding from the first edge to the second edge of the substrate W.

Therefore, the substrate processing apparatus can decrease the developing time (or the time of exposure to the developer) at different sites of the major surface of the substrate W in proceeding from the first edge to the second edge of the substrate W. This provides shorter developing time at a site where the development reaction is considered to be apt to accelerate, to further improve line width uniformity.

In particular, according to the first preferred embodiment, the rinsing solution is discharged in the direction opposite from the scanning direction A from the discharge opening 41 of the rinsing solution supply nozzle 40. Thus, the rinsing solution discharged from the discharge opening 41 flows in the direction opposite from the scanning direction A. This prevents the rinsing solution from flowing ahead of the rinsing solution supply nozzle 40 in the scanning direction A and from forcing the developer on the substrate W to flow ahead of the rinsing solution supply nozzle 40 in the scanning direction A.

In combination with this, the first preferred embodiment is advantageous in eliminating as completely as possible the influence of the flow of the rinsing solution and the forced flow of the developer on the substrate W to determine the second moving speed pattern of the rinsing solution supply nozzle 40 and the like, with consideration mainly given to the amount of acceleration of the development reaction.

Additionally, the higher speed of the second moving speed pattern of the rinsing solution supply nozzle 40 reduces the amount of rinsing solution to be used.

As an example, a resist film under the name "UV6" adaptable to a KrF light source was formed on a semiconductor wafer having a diameter of 200 mm. The optimum values of the first moving speed pattern and the second moving speed pattern were determined, using a developer which develops this resist film for the initial development process time of 12 seconds.

First, the developer supply nozzle 20 was moved in a pattern of a constant speed of 40 mm/sec (the first moving speed V1). Then, assuming that the rinsing solution supply nozzle 40 was moved in a constant speed pattern, a relationship was measured between the second moving speed V2 and variations in line width of a pattern formed on the semiconductor wafer. This showed that the line width variations were minimized when the rinsing solution supply nozzle 40 was moved at about 44 mm/sec, as indicated by the line P of FIG. 6.

The use of a developer which develops the resist film for the initial development process time of 60 seconds provides a result indicated by the line Q of FIG. 6, and is believed to make the second moving speed V2 of the rinsing solution supply nozzle 40 higher.

Second Preferred Embodiment

Next, the substrate processing apparatus according to a second preferred embodiment of the present invention will be described. In the second preferred embodiment, components similar to those of the substrate processing apparatus of the first preferred embodiment are designated by the same reference numerals and characters and are not particularly described. Only the differences therebetween will be mainly described.

Figure 7:
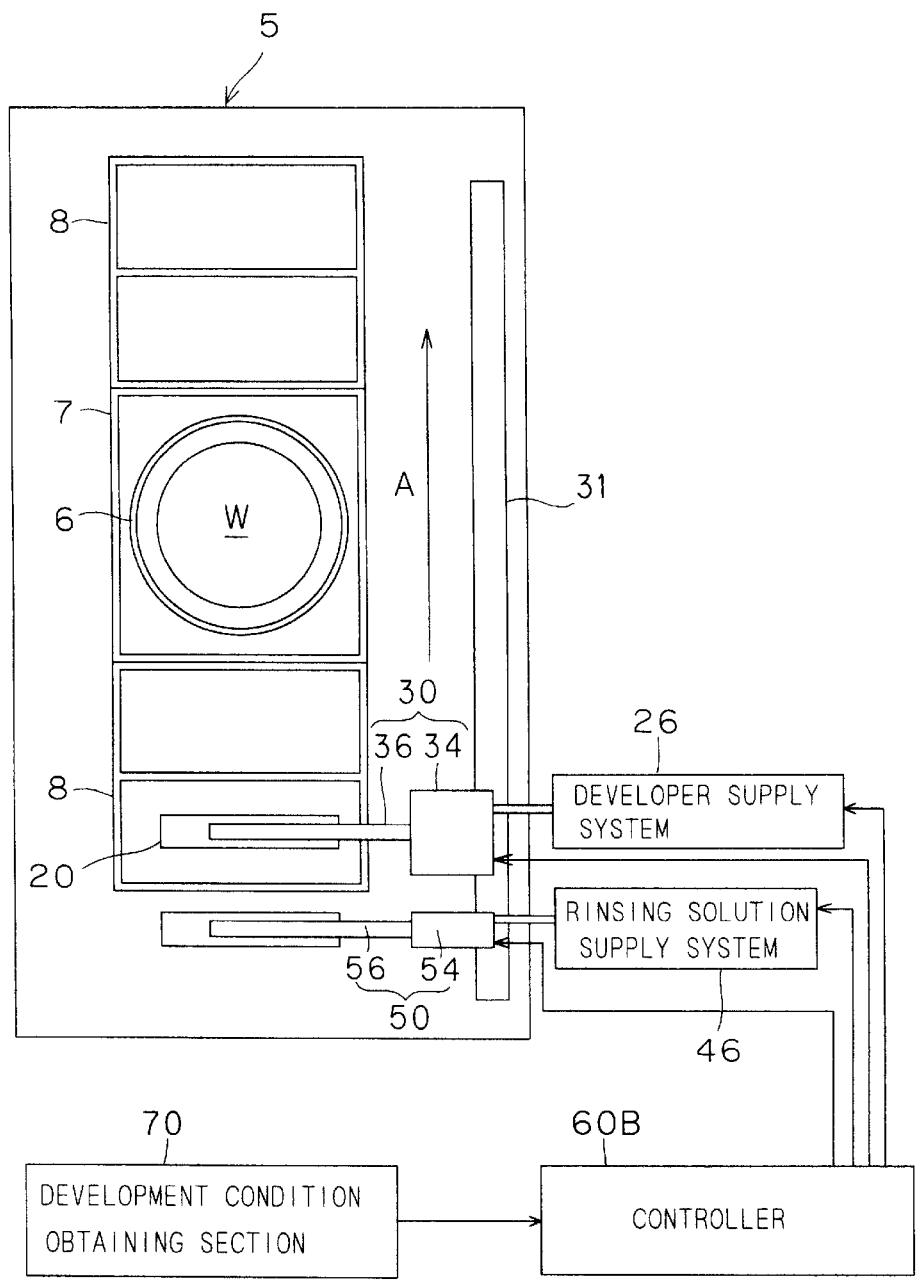
FIG. 7 is a schematic plan view of the substrate processing apparatus according to a second preferred embodiment of the present invention.
Figure 8:
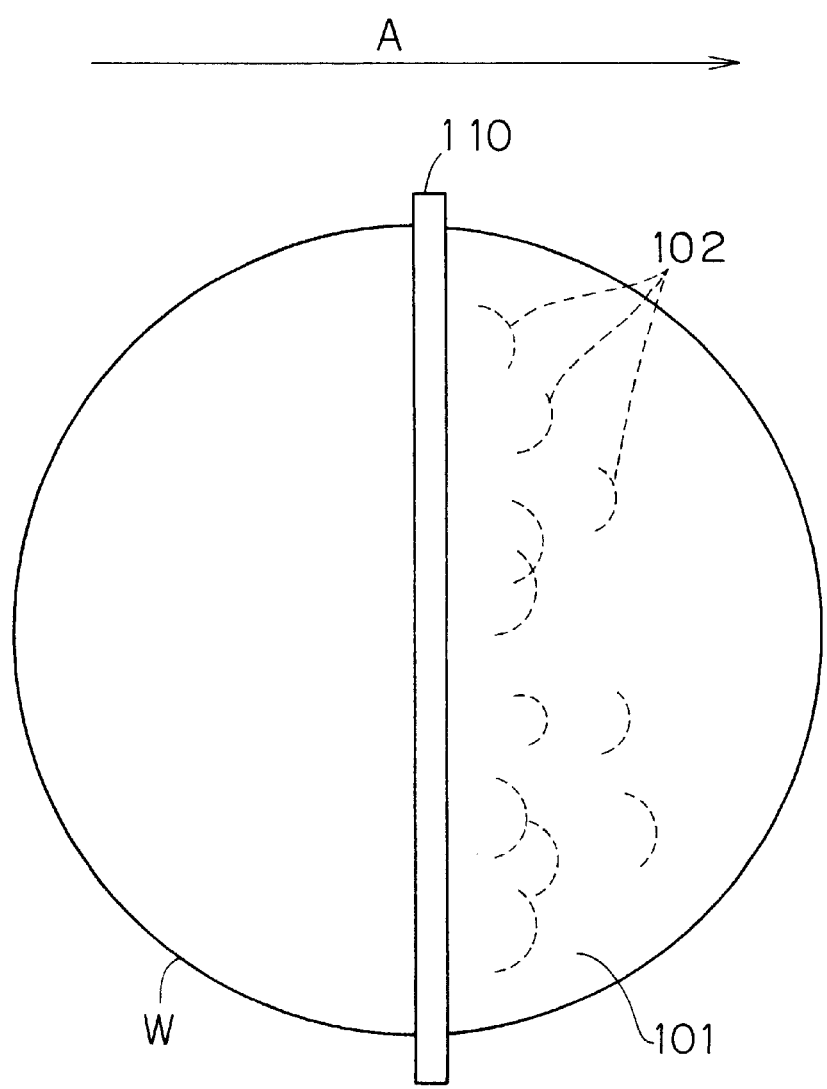
FIG. 8 is a view for illustrating fluctuations generated when a rinsing solution is dropped onto a substrate.

FIG. 7 is a schematic view of the substrate processing apparatus according to the second preferred embodiment.

The substrate processing apparatus of the second preferred embodiment further comprises a development condition obtaining section 70 for obtaining a development condition, in addition to the components of the substrate processing apparatus of the first preferred embodiment. A controller 60B has the speed pattern establishing function for establishing at least one of the first and second moving speed patterns in accordance with the obtained development condition, in addition to the functions of the controller 60.

The development conditions having an influence upon the optimum first and second moving speed patterns are assumed to include the type of resist, the type of developer, the concentration of developer, the rinsing solution discharge angle θ of the rinsing solution supply nozzle 40, and the like.

Specifically, different resin components contained in different types of resist result in different rates of reaction with a predetermined developer. The degree to which the development reaction is accelerated is considered to differ depending on the type of resist. For a resist very effective in accelerating the development reaction, it is necessary to provide a large speed difference (or a difference in developing time at different sites of the substrate W) between the first moving speed pattern and the second moving speed pattern. More specifically, it is considered that the speed difference (or developing time difference) must be large for resists for use in i-line exposure or KrF exposure, e.g. a novolac resin-based resist and a polyhydroxystyrene (PHS) resin-based resist, because these resists are very effective in accelerating the development reaction resulting from diffusion of the developer caused by the fluctuations of the developer. On the other hand, it is considered that the speed difference (or developing time difference) must be small for resists for use in ArF exposure, e.g. a methacrylic resin-based resist, because these resists are less effective in accelerating the development reaction.

As regards the type of developer, it is considered that the degree to which the development reaction is accelerated differs, for example, depending on whether or not a surfactant is added to the developer. Developers in common use are roughly divided into two types: a surfactant-free developer (e.g., a developer containing 2.38% TMAH (tetramethyl ammonium hydroxide), the balance being water); and a surfactant-added developer. The surfactant-added developer, which is low in surface tension, is considered to be significantly influenced by the fluctuations caused when the rinsing solution is dropped thereinto, and accordingly be very effective in accelerating the development reaction. It is therefore considered to be necessary that the speed difference (or developing time difference) is greater when the surfactant-added developer is used than when the surfactant-free developer is used.

As regards the difference in developer concentration, although a developer containing TMAH of a concentration of 2.38% is commonly used, a developer of a different concentration is used in some cases. A higher developer concentration provides a higher rate of development reaction to result in higher effectiveness in accelerating development because of the fluctuations. Thus, it is considered that the higher the concentration of the developer is, the greater the speed difference (or developing time difference) must be.

The rinsing solution discharge angle θ is as follows.

When a puddle of developer is formed on the substrate W and the development reaction proceeds to some degree, the developer is mixed with the resist reacted with and dissolved in the developer to cause changes in the surface tension of the puddle of developer and in contact angle of the developer with the substrate surface. The degree to which the surface tension and the contact angle change differs depending on the type of resist and the type of developer. Thus, when applying the rinsing solution onto the substrate W to rinse off the developer, it is desirable that the optimum rinsing solution discharge angle θ is changed depending on the type of resist and the type of developer, rather than is held constant. Changing the rinsing solution discharge angle θ changes the influence of the fluctuations upon the developer ahead of the rinsing solution supply nozzle 40 relative to the scanning direction A, as a natural consequence. As the discharge angle θ decreases (or as the direction in which the rinsing solution is discharged approaches the normal to the substrate W), the influence of the fluctuations increases to increase the effect of accelerating the development reaction. Conversely, as the discharge angle θ with respect to the substrate W increases (or as the direction in which the rinsing solution is discharged approaches the parallelism with the substrate W), the influence of the fluctuations decreases to decrease the effect of accelerating the development reaction. It is therefore considered that the smaller the discharge angle θ with respect to the substrate W is, the greater the speed difference (or developing time difference) must be.

The development conditions stated above are only illustrative and may include other development conditions such as the rate of flow of the rinsing solution discharged from the rinsing solution supply nozzle 40 and the shape of the discharge opening 21.

The development condition obtaining section 70 obtains at least one of the development conditions as described above. This development condition is established, for example, by operator's manual entry using an input device.

The controller 60B establishes at least one of the first moving speed pattern and the second moving speed pattern in accordance with the obtained development condition.

The controller 60B comprises a storage section having stored therein a table containing first moving speed patterns and second moving speed patterns associated with various development conditions. The first moving speed patterns and second moving speed patterns associated with the various development conditions are those previously obtained by experiment, by experience or by deduction. A first moving speed pattern and a second moving speed pattern are determined from the obtained development condition by referencing the table. The determination of the first moving speed pattern and the second moving speed pattern may be made by multiplying default settings of the first and second moving speed patterns by a coefficient associated with the various development conditions.

The substrate processing apparatus according to the second preferred embodiment determines at least one of the first moving speed pattern and the second moving speed pattern in accordance with the development condition including the type of resist, the type of developer, the concentration of developer, the rinsing solution discharge angle of the rinsing solution supply nozzle, and the like. Even if a change is made to the development condition such as the type of resist, the type of developer, the concentration of developer, and the rinsing solution discharge angle of the rinsing solution supply nozzle, the substrate processing apparatus can improve the line width uniformity in accordance with the development condition.

Modifications

Although the preferred embodiments of the present invention have been described hereinabove, the present invention is not limited to the preferred embodiments.

The first and second preferred embodiments are based on the assumption that the first moving speed pattern is defined as a constant speed pattern having the first moving speed V1, and the second moving speed pattern is defined as a constant speed pattern having the second moving speed V2 higher than the first moving speed V1. However, the present invention is not limited to such an assumption. For example, either one or both of the first and second moving speed patterns may be a constant acceleration pattern. As another example, the moving speed of the developer supply nozzle 20 and the moving speed of the rinsing solution supply nozzle 40 may be the same at the first edge of the substrate W. In short, it is only required that the developing time at different sites of the substrate W decreases in proceeding from the first edge to the second edge of the substrate W. In other words, it is only required that the moving speed of the rinsing solution supply nozzle 40 is higher than that of the developer supply nozzle 20 at different sites ranging from the first edge to the second edge of the substrate W except at the first edge of the substrate W (at which the nozzles 20 and 40 start moving).

The developer supply nozzle 20 and the rinsing solution supply nozzle 40 may be integrated together and moved by a single moving mechanism. In this case, the developer supply nozzle 20 and the rinsing solution supply nozzle 40 move from the side of the first edge to the side of the second edge of the substrate W to apply the developer onto the substrate W, move back to the side of the first edge of the substrate W, and then move again from the side of the first edge to the side of the second edge of the substrate W to apply the rinsing solution onto the substrate W.

In this case, after the application of the developer, the developer supply nozzle 20 and the rinsing solution supply nozzle 40 may apply the rinsing solution onto the substrate W rotated substantially 180 degrees in the course of return to the initial position, in place of moving back to the side of the first edge of the substrate W without any processing.

The direction of movement of the developer supply nozzle 20 and the rinsing solution supply nozzle 40 is determined with reference to the first edge and the second edge of the substrate W.

Still another modification may be made such that the developer supply system mechanism 26 and the rinsing solution supply system mechanism 46 are coupled to a single nozzle which functions both as the developer supply nozzle and as the rinsing solution supply nozzle depending on the opening and closing of a valve mechanism.

While the invention has been described in detail, the foregoing description is in all aspects illustrative and not restrictive. It is understood that numerous other modifications and variations can be devised without departing from the scope of the invention.

What is claimed is:

1. A substrate processing apparatus comprising:
   a substrate holder for holding a substrate;
   a developer supply nozzle including a first discharge opening having a length substantially not less than the size of a major surface of said substrate;
   a first moving mechanism for moving said developer supply nozzle from the side of a first edge of said substrate to the side of a second edge of said substrate opposite from said first edge;
   a rinsing solution supply nozzle including a second discharge opening having a length substantially not less than the size of the major surface of said substrate;
   a second moving mechanism for moving said rising solution supply nozzle from the side of said first edge of said substrate to the side of said second edge of said substrate; and a controller for causing said developer supply nozzle to move in a first moving speed pattern from the side of said first edge of said substrate to the side of said second edge of said substrate to apply a developer onto the major surface of said substrate, and then causing said rinsing solution supply nozzle to move in a second moving speed pattern from the side of said first edge of said substrate to the side of said second edge of said substrate to apply a rinsing solution onto said major surface of said substrate, wherein said first moving speed pattern and said second moving speed pattern are established so that developing time at different sites of said substrate decreases in proceeding from the side of said first edge to the side of said second edge.

2. The substrate processing apparatus according to claim 1, wherein said first moving speed pattern is a constant speed pattern having a first moving speed;

said second moving speed pattern is a constant speed pattern having a second moving speed; and said second moving speed is higher than said first moving speed.

3. The substrate processing apparatus according to claim 2, wherein said second discharge opening discharges said rinsing solution in a first direction opposite from a second direction in which said rinsing solution supply nozzle moves from the side of said first edge of said substrate to the side of said second edge of said substrate.

4. The substrate processing apparatus according to claim 3, further comprising:

a development condition obtaining section for obtaining a development condition; and a speed pattern establishing section for establishing at least one of said first moving speed pattern and said second moving speed pattern in accordance with the obtained development condition.

5. The substrate processing apparatus according to claim 4, wherein said development condition includes information about at least one of the type of resist, the type of developer, the concentration of developer, and an angle at which said rinsing solution supply nozzle discharges said rinsing solution.

6. An apparatus for chemically processing a major surface of a substrate, comprising:

an applying part for applying a chemical solution sequentially onto a first region and a second region of said major surface; and a removing part for removing said chemical solution sequentially from said first region and said second region, wherein a first exposure time period for which said first region is exposed to said chemical solution is longer than a second exposure time period for which said second region is exposed to said chemical solution.

7. The apparatus according to claim 6, wherein said removing part applies a rinsing solution sequentially onto said first and second regions to rinse away said chemical solution from said first and second regions.

* * * * *